United States Patent [19]

Drangeid et al.

[11] 3,735,390

[45] May 22, 1973

[54] METHOD AND CIRCUIT FOR CONVERTING AN ANALOG SIGNAL INTO A SIMULTANEOUS DIGITAL SIGNAL

[75] Inventors: Karsten E. Drangeid, Hedingen; Andreas Moser, Thalwil, both of Switzerland

[73] Assignee: International Business Machines Corporation, Armonk, N.Y.

[22] Filed: Mar. 31, 1971

[21] Appl. No.: 129,823

[30] Foreign Application Priority Data

Apr. 7, 1970 Switzerland ..........................5087/70

[52] U.S. Cl. ............................340/347 AD, 307/282

[51] Int. Cl. .............................................H03k 13/02

[58] Field of Search .................340/347 AD; 307/282

[56] References Cited

UNITED STATES PATENTS

| | | | |
|---|---|---|---|
| 3,594,766 | 7/1971 | Gilbert | 340/347 AD |
| 2,997,602 | 8/1961 | Eachus | 307/282 |
| 3,610,960 | 10/1971 | Hofstein | 340/347 AD |
| 3,427,609 | 2/1969 | Molnar | 340/347 AD |

*Primary Examiner*—Maynard R. Wilbur
*Assistant Examiner*—Jeremiah Glassman
*Attorney*—Hanifin and Jancin and Bernard N. Wiener

[57] ABSTRACT

The present invention relates to a method for converting an analog signal into a simultaneous digital signal and to a circuit for carrying out the method. Therefore, the complete digital representation of any analog signal is currently available for further use.

In the practice of this analog to digital conversion method, an electrical scale is generated having a number of n steps for evaluating amplitudes of analog signals. The amplitudes are measured by comparison to the electrical scale. At any time during measurement, a signal indicates the highest step of the scale being exceeded.

An analog to digital converter circuit hereof has at least $n - 1$ pairs of diodes which are connected in parallel with opposed polarity. A calibrated constant current is fed to each pair of diodes for generating a stepped electrical scale. At least one electronic switch is included for each step of the scale which is responsive to the potential difference between the terminals of a diode pair and which controls the digital representative of measured values.

15 Claims, 6 Drawing Figures

INVENTORS
KARSTEN E. DRANGEID
ANDREAS MOSER

BY Bernard N. Wiener
ATTORNEY

METHOD AND CIRCUIT FOR CONVERTING AN ANALOG SIGNAL INTO A SIMULTANEOUS DIGITAL SIGNAL

BACKGROUND OF THE INVENTION

Analog representation is a natural mode for evaluating an technological process. The object is to collect data which will undergo further processing. However, processing of such data to the best advantage occurs more often in digital form. Therefore, there is a need for suitable methods to convert an analog value to a digital representation. Possible uses for analog to digital conversion are unlimited. These converters are used widely in electronics; and they are needed in particular when only indirect use can be made of the information obtained. Most applications are to be found in process control, information processing and communication engineering because of the advantages obtained from transmitting, processing and storing data in digital form.

In most known methods of analog to digital conversion, analog values are sampled at specific time intervals and then stored. The stored sampling values are then evaluated repeatedly, e.g., by comparison with reference values, to obtain the proper digital values. The digital data may be used directly or after buffering. As the measuring steps have to be applied to each sample, high operation speed is desirable for analog wide-band applications.

Each of the prior art operational steps has been performed by many different electronic devices. It is known that active elements, e.g., amplifiers, impedance converters, and feedback circuits have substantially limited the operating speed of a analog to digital converters. Therefore, it is important that the number of active elements be minimized to obtain high operating speed and it is desirable that the fastest available active devices be used. Further, it must also be determined if the conversion procedure is suitable for high speed operation. A procedure which generates simultaneously all digits for one analog value is very convenient. However, there usually must be as many comparators as there are quantization steps for the analog to digital conversion. As a consequence, much circuitry is needed and the economy of the solution is impaired. The fewer the steps which are linked to make up the analog to digital conversion, the better does the procedure work at high speed.

Similarly, the quality of the results obtained is dependent on the kind and the number of circuit elements used. Use of simple circuits with a minimum number of active elements will tend to insure high precision operation. In this manner, undesired time delays can be avoided. Prior art methods and circuits for analog to digital conversion have not solved all problems or avoided all the difficulties mentioned.

OBJECTS OF THE INVENTION

It is an object of the present invention to provide method and circuit for converting without any delay analog signals to digital signals so that the digital signals appear simultaneously with the analog signals.

It is a further object of this invention to provide method and circuit for generating a complete digital representation of an analog signal without staggering the single bits.

It is an object hereof to practice the preceding object so that the digits of a binary representation are available in parallel.

It is another object of the invention to provide a circuit for processing wide band analog signals having simplicity of design and appropriate elements.

It is another object of the analog to digital converter capable of processing a considerable rate of information, e.g., voice and video signals.

It is another object of this invention to provide an analog to digital converter having reliability and stability.

SUMMARY OF THE INVENTION

The analog to digital conversion method of this invention is characterized by: an electrical scale which is generated having a number of small n steps for evaluating amplitudes of analog signals; the amplitudes are measured by comparison to the electrical scale; and at any time during measurement, a signal indicates the highest step of the scale being exceeded. An analog to digital converter circuit for executing the noted method of this invention is characterized by having: at least n - 1 pairs of diodes which are connected in parallel with opposed polarity; a calibrated constant current is fed to each pair of diodes for generating a stepped electrical scale; and at least one electronic switch for each step of the scale which is responsive to the potential difference between the terminals of the diode pair and which controls the digital representation of measured values.

The foregoing and other objects, features and advantages of the invention will be apparent from the following more particular description of preferred embodiments of the invention, as illustrated in the accompanying drawings.

DESCRIPTION OF THE EMBODIMENTS

Figures 1A, 1B, 1C:
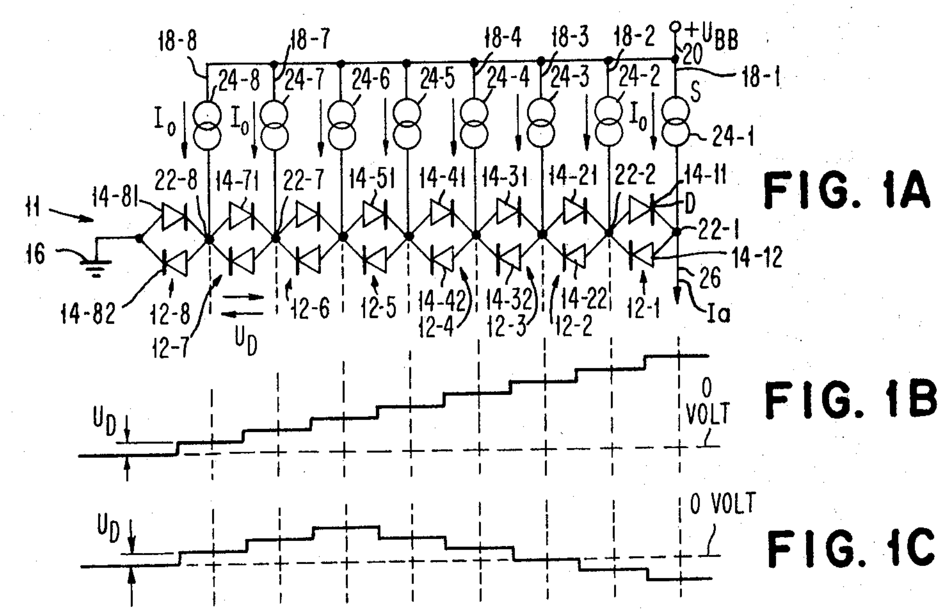
FIG. 1A shows a circuit according to the principles of this invention with a series connection of a plurality of diode pairs for the generation of a voltage scale having eight steps.
FIG. 1B illustrates the voltage distribution obtained with the circuit of FIG. 1A when the analog current $I_a$ is equal to zero.
FIG. 1C illustrates the voltage distribution when the analog current $I_a$ has a value between $5I_0$ and $6I_0$.

FIG. 1A shows a row 11 with eight diode D pairs 12–1 to 12–8 in which the two diodes of each pair, e.g., upper diode 14–11 and lower diode 14–12 of diode pair 12–1 are connected in parallel with opposed polarity. All pairs in series connection form row 11 which at the left is at ground potential 16. Leads 18–1 to 18–8 are brought from a conductor 20 having the voltage of +

$U_{BB}$, to each node 22–1 to 22–8 in the row of diode pairs 12–1 to 12–8 via a respective constant current source S 24–1 to 24–8 which feeds a current $I_0$ to each one of the nodes in the diode chain. The node 22–1 of the diode pair 12–1 at the right end of the row is also connected to a lead 26 through which analog current $I_a$ is drawn from the circuit.

The voltage distribution is depicted in FIG. 1B along the row 11 of diode pairs for the quiescent state, i.e., when current $I_a$ equals zero. All eight currents $I_0$ which are supplied by the constant current sources S flow to the ground connection 16 through at least one or more diode pairs 12–1 to 12–8. In accordance with the polarity of the diodes, only one diode of a pair conducts electric current between the electrodes of any diodes through which current flows. The node to the right side of any diode pair is at a voltage augmented by $U_D$ thereof with respect to the voltage of the node to the left side. In this way, the stepped voltage is generated shown in the diagram of FIG. 1B whereby any single step corresponds to the voltage difference $U_D$ between the nodes of a diode pair.

In FIG. 1C a voltage distribution is shown along the same row of diode pairs when analog current $I_a$ is not zero. Illustratively, it is assumed that the actual value of current $I_a$ is between $5I_0$ and $6I_0$. Therefore, the stepped voltage diagram has changed as shown in FIG. 1C. Previously, the voltage dropped uniformly in steps from the right end of the row of diode pairs 12–1 to 12–8 to ground potential at the left. With analog current $I_a$, node 22–6 between diode pairs 12–5 and 12–6 is at the highest relative potential. From this point 22–6 on to the right, the voltage drops in steps of $U_D$ for each diode pair, since the direction of current flow has been reversed. When $I_a$ reaches a value higher than $5I_0$, at least the currents of five constant sources S and even part of a sixth have to flow to the right. Therefore, in this part of the row 11 of diode pairs, the other diode of each pair depending on its polarity will conduct the current. The voltage drops to the right until at the end of the row it reaches a value which is 2 $U_D$ below zero or ground potential.

The form of the stepped voltage diagram depends on the value of the analog current $I_a$. The position of the node at the highest relative potential indicates that value. If current $I_a$ is higher in value than $8I_0$, the beginning of the row at the left is grounded, which is simultaneously the point of highest relative potential. All modes from there on to the right till the end of the row 11 have a voltage which is lower by a number of $U_D$ depending on the distance from the ground 16. Therefore, the behavior of the present circuit indicates the value of current $I_a$, a scale of eight steps being available for that purpose. If current $I_a$ varies in proportion to an analog signal, within the eight steps the indication is proportional to the analog signal. The digital indication is given without any delay as this depends solely on the reaction time of the current carrying circuit elements which are used. A result is obtained as soon as an analog signal $I_a$ is applied to node 22–1. The number of diode pairs in the row can be selected freely and the behavior of the circuit does not depend on the number of stages therein.

Figure 2:
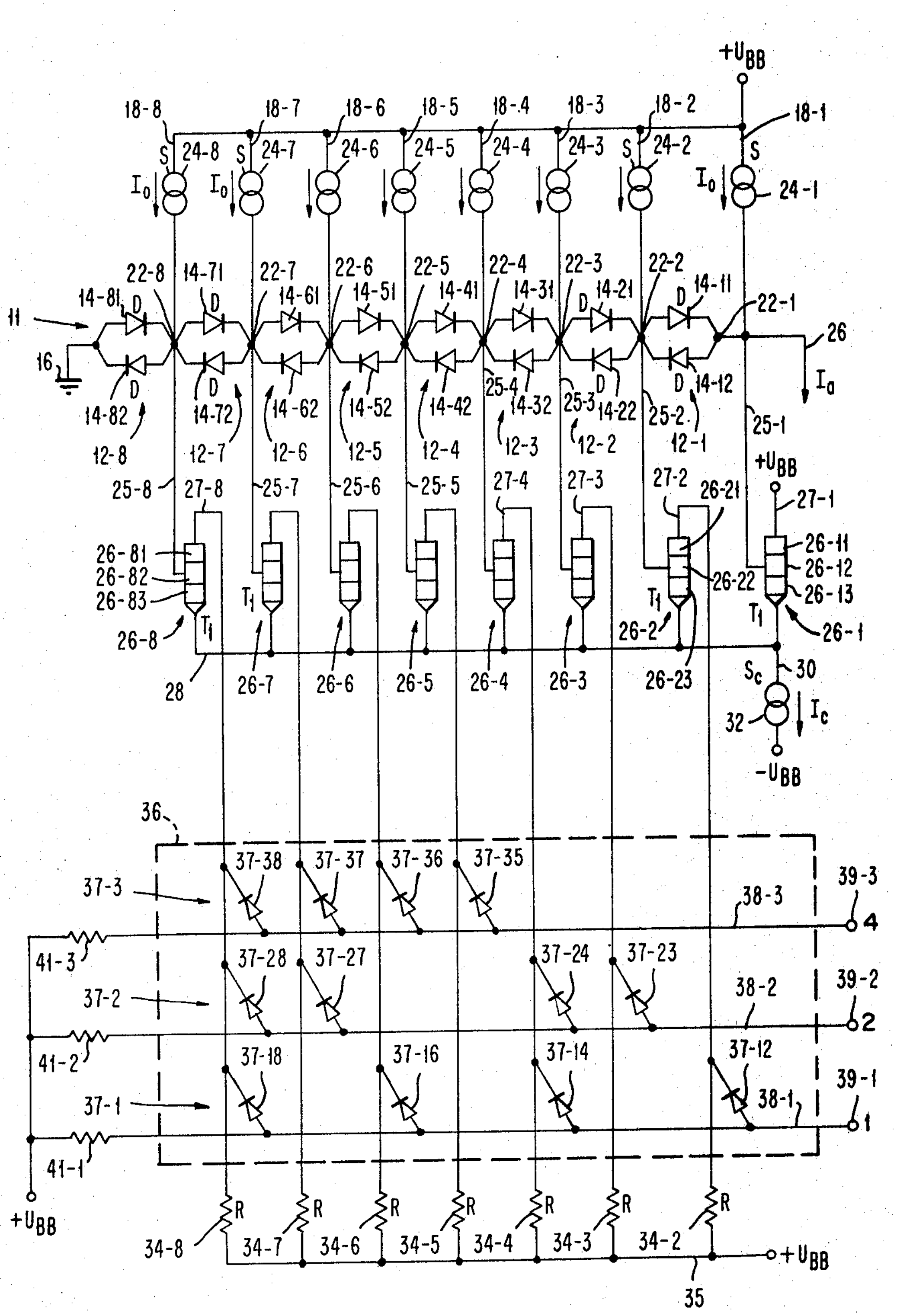
FIG. 2 is a first embodiment of an analog to digital converter according to this invention having transistor switches for indicating $2^3$ quantization steps and a matrix for binary coding of the indication.

The row 11 of diode pairs of FIG. 1A is shown again in FIG. 2. To the circuitry of FIG. 1A have been added NPN switching transistors $T_1$, a constant current source $S_c$ for supplying a current $I_c$ to the switching transistors and an encoder matrix 36 for conversion of the indicative results to binary information. There are as many transistors as there are diode pairs. Each of the switching transistors 26–1 to 26–8 has its base, e.g., base 26–12, connected to one node, e.g., 22–1, of the row 11 of diodes. Nodes 22–1 to 22–8 are connected via lines 25–1 to 25–8 to bases 26–12, 26–22, . . . 26–82, of transistors 26–1 to 26–8, respectively. The emitter, e.g., 26–13, of transistor 26–1, of each transistor $T_1$ is connected to a common line 28 and to one terminal 30 of constant current source $S_c$ 32. The other terminal of current source 32 is tied to supply voltage $-U_{BB}$. Each collector lead of the switching transistors $T_1$ other than of transistor 26-1 connects to a separate load resistor R 34–2 to 34–8 respectively which is connected to a supply voltage $+U_{BB}$ via connector 35. The collector 26–11 of the last transistor $T_1$ is excepted, the base of which is in contact with the last node 22–1 at the right end of the diode row. This last collector lead is directly tied to the supply voltage $+U_{BB}$ without a load resistor.

The encoding matrix 36 is a diode matrix of conventional type. If desired, another appropriate type of matrix or encoder may be selected. In the present circuit arrangement, the collector leads 27–2 to 27–8 of the switching transistors $T_1$ 26–2 to 26–8, respectively, represent the column conductors of the matrix. The collector 26–11 of transistor 26–1 is not associated with the matrix 36. The encoder matrix 36 has three rows of diodes 37–1 to 37–3 and three output lines 38–1 to 38–3 which are connected to terminals 39–1 to 39–3, respectively. Output lines 38–1 to 38–3 are connected at the left ends thereof to resistors 41–1 to 41–3, respectively whose other ends are connected in common to voltage $+U_{BB}$. At selected crosspoints of rows and columns diodes are inserted between the respective conductors. Diodes 37–12, 37–14, 37–16 and 37–18 are connected between collector lines 27–2, 27–4, 27–6 and 27–8, respectively, and output line 38–1. Diodes 37–23, 37–24, 37–27 and 37–28 are connected between collector lines 27–3, 27–4, 27–7 and 27–8, respectively, and output line 38–2. Diodes 37–35 to 37–38 are connected between collector lines 27–5 to 27–8 and output line 38–3. The cathodes of the diodes of encoder matrix 36 are connected to appropriate collector lines 27–2 to 27–8 and their anodes are connected to the appropriate output line 38–1 to 38–3. Illustratively, the cathode and anode of diodes 37–24 are connected to collector line 27–4 and output line 38–2, respectively. In the encoder matrix 36, the diodes are distributed in such a way that the signals appearing at the output lines 38–1 to 38–3 represent the common 4–2–1 binary code. Alternatively, a diode distribution can be selected for any desirable code.

The operation of the circuit arrangement of FIG. 2 will now be described. When there is an analog current $I_a$, a stepped voltage distribution forms along the row of diode pairs as has been described in accordance with FIGS. 1A and 1C. One of the nodes between the diodes D will be at the highest potential within the row 11 of diode pairs. The switching transistor whose base is connected to that node will now carry the current $I_c$ from the related constant current source $S_c$. Therefore, the base-emitter junction of this transistor will develop a voltage drop of the same order of magnitude as the voltage drop $U_D$ across one of the diodes D. As all emitters of transistors $T_1$ are tied together and have the same voltage, the base-emitter voltage conditions which develop for all other transistors drive them substantially to current cut-off. Normally, the switching transistor having the highest base potential will carry all of the current $I_c$. The diode circuit does not have negative resistance characteristic. Therefore, the current $I_c$ may flow through two adjacent switching transistors $T_1$. Thus, the possible indication error equals the value of one step. If an encoder matrix is selected which uses the known "Gray" code instead of the common binary code, the error will never exceed one step.

One of the switching transistors $T_1$ carries current which is dependent on the amplitude of the analog current $I_a$. The analog current amplitude which is a function of time is converted in this way to a function of position in the row 11 of diode pairs. The current $I_c$ which flows through one of the collector leads represents an input signal to the encoder matrix 36. As shown in FIG. 2, this signal will be transformed into a binary digital representation. Details of the conversion process will not be discussed further herein. In the circuit arrangement shown, there is no provision for signal storing. Therefore, the digital indication corresponding to an analog signal may change continuously. For further use of the digital representation provided by the analog to digital converter, pluses must be generated which may be accomplished in the following three ways:

1. Each of the digital outputs of the matrix 36 is passed to an AND-gate, not shown, which is enabled periodically by sampling pulses, not shown.
2. The constant current source $S_c$ supplying the current $I_c$ to the switching transistors $T_1$ is strobed at the rate of sampling pulses.
3. The analog signal is sampled at the rate of sampling pulses and the samples $I_a$ are applied to the analog input of the converter which is node 22–1 of FIG. 2.

In cases 1 and 2, the analog to digital converter should be built for a bandwidth which fits the bandwidth of the analog signal. However, in case 3, a bandwidth is utilized which is appropriate to the broader frequency range of the digital signals.

Figure 3:
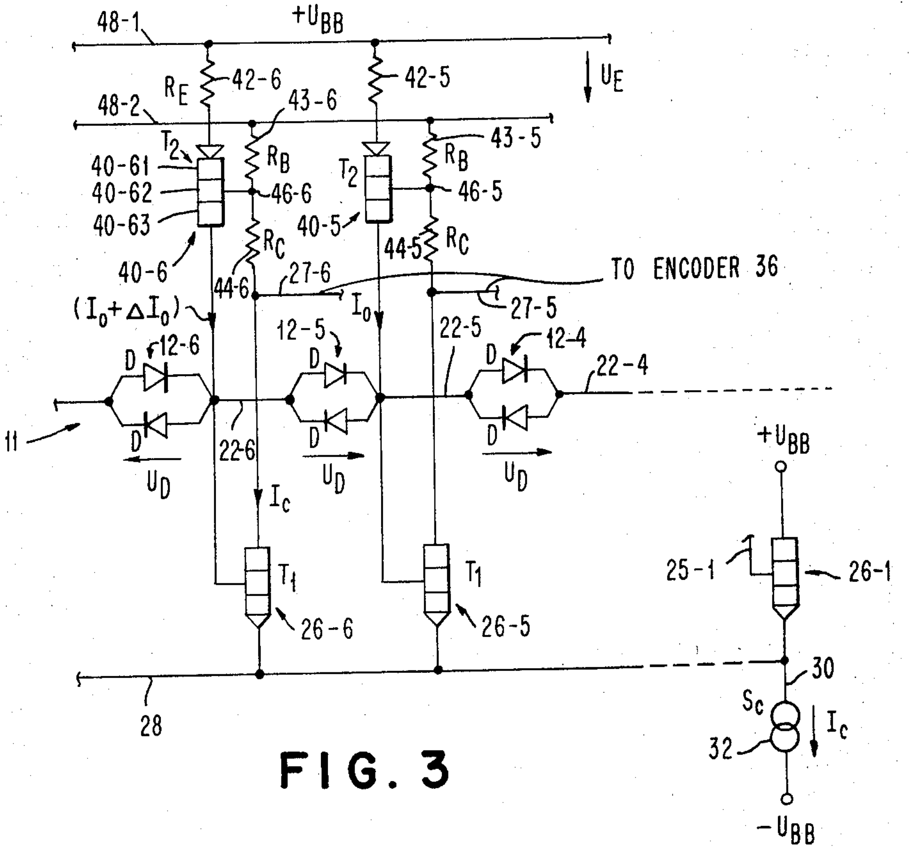
FIG. 3 shows another indicating circuit with feedback from the indicator output to the calibrated current $I_0$ feed to the corresponding node in the row of diode pairs.

As noted above, the stepped scale level detector circuit of this invention shown in FIG. 2 includes in its switching operation some ambiguity. This ambiguity can be overcome by using the exemplary circuit shown in FIG. 3. By using feedback with a level detector circuit, a negative resistance characteristic is introduced which removes the ambiguity. The circuit of FIG. 3 shows only a part of an arrangement similar to the one in FIG. 2. Circuit elements of the same kind and having the same functions in both circuit diagram of FIGS. 2 and 3 bear the same character or figure references.

Three diode pairs 12–4 to 12–6 of a row 11 are depicted in FIG. 3. Arrow $U_D$ indicates the direction of voltage drop across the diodes. The nodes 22–5 and 22–6 between diode pairs 12–4 and 12–5 and between diode pairs 12–5 and 12–6 are connected to the bases of related switching transistors $T_1$ (26–5 and 26–6, respectively) and to the collectors of other related PNP transistors $T_2$ (40–5 and 40–6). The emitter lead (e.g., 47–5 and 47–6) of each transistor $T_2$ is in series connection with a resistor $R_E$ (42–5 and 42–6, respectively) and the positive supply voltage $+U_{BB}$ on line 48–1. From a second supply voltage line 48–2 the voltage of which is lower than $+U_{BB}$ by a value $U_E$, two resistors $R_B$ (e.g., 43–5 and 43–6) and $R_C$ (e.g., 44–5 and 44–6) are tied in series lead to the collector of each transistor $T_1$. The junction between each pair of resistors $R_B$ and $R_C$ (e.g., 46–5 and 46–6) is connected to the base (e.g., 40–52 and 40–62) of the related transistor $T_2$ (40-5 and 40-6, respectively) associated with that node. The collector lead (e.g., 27–5 and 27–6) of each transistor $T_1$ (e.g., 26–5 and 26–6) goes to the encoding matrix 36, as shown in FIG. 2. The emitter leads of transistors $T_1$ are connected via bus 28 to a constant current source $S_c$ 32 supplying a current $I_c$. The operation of the circuit of FIG. 3 will now be described. Each transistor $T_2$ with the associated resistors $R_E$ and $R_B$ forms a current source supplying a current $I_0$ during the quiescent state to a node between two adjacent diode pairs. $R_B$ is the base resistor of a transistor $T_2$ and together with a resistor $R_C$ represents the load resistor of a transistor $T_1$ which connected to that node. If as indicated by an arrow $U_D$, the first node (e.g. 22–6) to the left is at a potential somewhat higher than the next node (e.g., 22–5) to its right, then the switching transistor $T_1$ which is connected to the first of the nodes carries current $I_c$. This current $I_c$ causes a voltage drop across resistor $R_B$ and thereby controls the associated transistor $T_2$ in such a way that collector current $I_0$ is increased by an increment $\Delta I_0$. The two formulas below explain the described relation:

$$I_0 \cong U_E/R_E \text{ and } \Delta I_0 \cong (I_c\, R_B/R_E)$$

The higher current which is supplied to the node 22–6 between two diode pairs assists the effect obtained by a higher voltage at this point and precludes the splitting of current $I_c$ in two parts through two adjacent switching transistors $T_1$ (e.g., 26–5 and 26–6).

The analog to digital converter shown in FIG. 2 and FIG. 3 can also be built with bipolar as well as with unipolar circuit elements. Two advantages are obtained when Schottky diodes and Schottky-field-effect transistors are used. Firstly, the series connected row of diode pairs has a broader bandwidth because Schottky diodes do not exhibit carrier storage effects. Secondly, during level detection in a circuit as illustrated in FIG. 2, higher gain is obtained because the input impedance of a Schottky field-effect transistor is much higher than the input impedance of a bipolar transistor. Consequently, during the operation of the circuit, the ambiguity in level detection is much more restricted and the probability of obtaining indication errors is quite low. In accordance with the principles of this invention, other circuit configurations may conveniently be designed having similar properties to the circuit depicted in FIG. 3.

Figure 4:
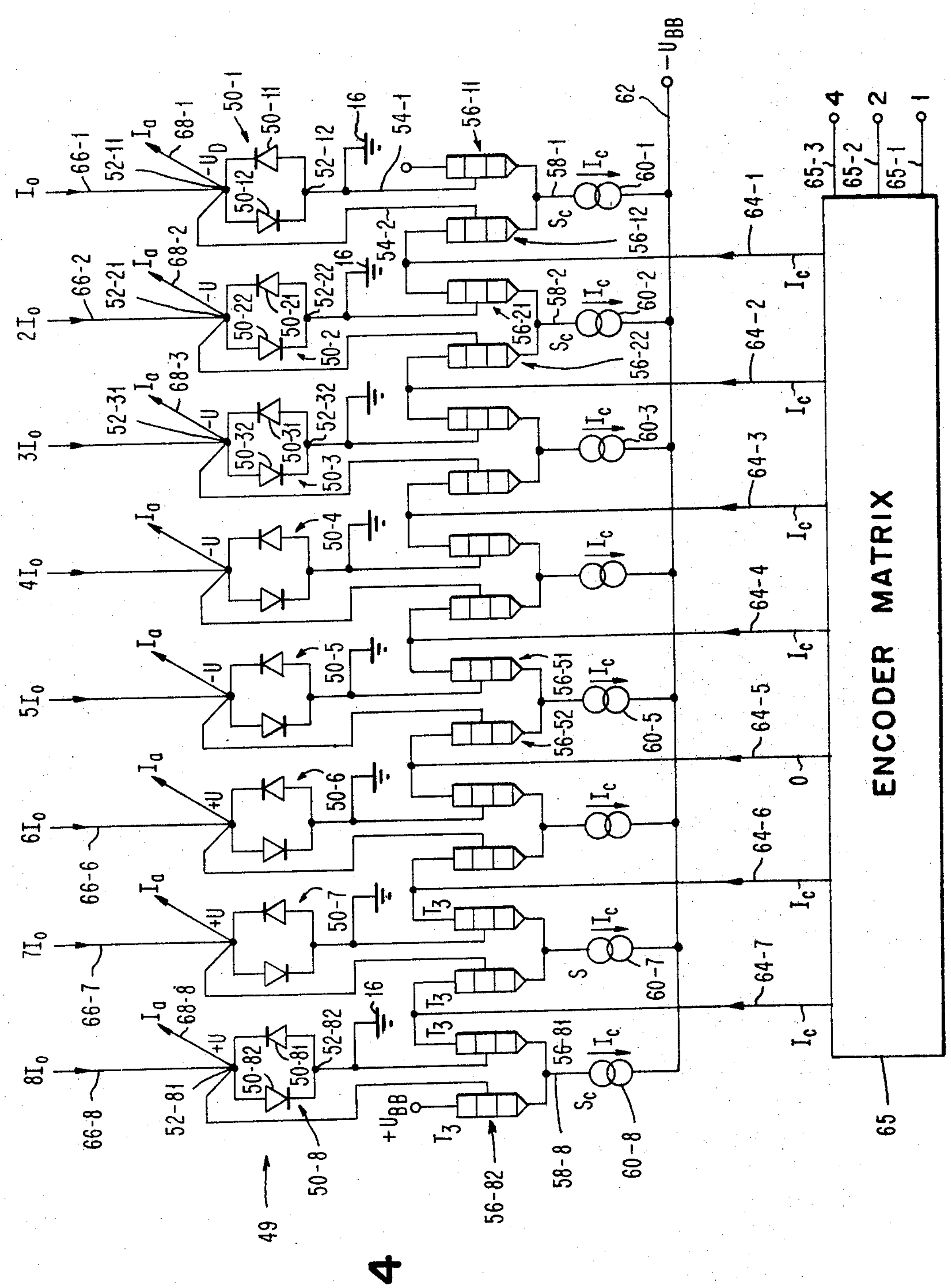
FIG. 4 illustrates a second embodiment of an analog to digital converter according to this invention exhibiting single diode pairs with a relatively low potential difference between the ends of a row of such pairs.

An embodiment of an analog to digital converter in accordance with the present invention as discussed so far comprises a series connection of diode pairs. The number of such pairs corresponds to the number of stepped values. An analog signal will be evaluated within the number of these steps and converted to a digital representation. The number of stepped values is dependent on the desired accuracy which in principle may be chosen optionally. In practice, the upper limit is reached very soon because a great number of series connected diode pairs develop a voltage drop along the row which is sometimes undesirable in the microcircuits used today. A schematic circuit of another embodiment of the invention is shown in FIG. 4 which does not have a series connection of diode pairs. Consequently, the embodiment of FIG. 4 does not have a high potential difference between adjacent diode pairs.

The circuit of FIG. 4 is arranged for eight stepped values and comprises eight diode pairs 50–1 to 50–8. The two diodes of any pair (e.g., 50–11 and 50–12) are connected in parallel with opposed polarity and one of the terminals 52–12 is grounded. The lower terminal 52–12 of the pair is tied to the base lead (e.g. 54–1) of an NPN switching transistor $T_3$. The emitter lead (e.g. 58–1) of the two related transistors $T_3$ (56–11 and 56–12) are connected in common to a constant current source $S_c$ (e.g. 60–1) which supplies a current $I_c$ and the other terminal of current source $S_c$ is attached to supply voltage $-U_{BB}$ via connector 62. In FIG. 4 each diode pair is shown disposed vertically above the two NPN switching transistors $T_3$ associated with it and eight such diode pairs are disposed in parallel side by side.

Any two neighboring switching transistors $T_3$, e.g., 56–12 and 56–21, in FIG. 4 which are associated with different diode pairs, e.g., 50–2 and 50–1, respectively, possess a common collector line, e.g., 64–1, leading to an encoder 65 which may be designed basically according to the same principle as the encoder 36 of FIG. 2. Account must be taken for the design of encoder 65 that one of lines 64–1 to 64–7 has zero current and each of the others has current whereas one of the lines 27–2 to 27–8 of FIG. 2 has current and all others do not have current. There are seven collector leads, 64–1 and 64–7. Fourteen of sixteen switching transistors $T_3$ are engaged with the collector leads. The collectors of the first and of the last transistors $T_3$, i.e., 56–11 and 56–82, in the row 49 are connected directly to the supply voltage $+U_{BB}$. The upper terminal, i.e., 52–11, 52–21, . . . 52–81, of each diode pair is connected to two lines and is connected to the base of one related switching transistor $T_3$. Over one line, i.e., 66–1 to 66–8, a calibrated current, i.e., $I_0$ to $8I_0$, is supplied to each diode pair, i.e., 50–1 to 50–8, respectively. Over the other line, i.e., 68–1 to 68–8, a current $I_a$ is drawn which is proportional to an input analog signal.

The operation of the circuit arrangement of the embodiment of this invention shown in FIG. 4 will now be described. When the analog signal $I_a$ equals zero, the upper terminal of each diode pair, i.e., 52–11, 52–21, . . . 52–81, exhibits a positive voltage $+U_D$ relative to ground as only a current of one or more times $I_0$ is supplied. The left switching transistor $T_3$ of the two transistors associated with a diode pair carries a current $I_c$ and each one of the seven common collector lines, i.e., 64–1 to 64–7, leading to encoder matrix 65 carries a current $I_c$. The situation changes when current $I_a$ is proportional to an analog signal which is not equal to zero. It is assumed for the exemplary operation of the circuit shown in FIG. 4 that $I_a$ has a value between $5I_0$ and $6I_0$. The voltage at the upper terminal of each of the first five diode pairs, i.e., 52–11, 52–21 . . . 52–51, counted from right to left becomes $-U_D$ relative to ground. Further, the left switching transistor $T_3$, i.e., 56–52, associated with diode pair 50–5 does not carry the current $I_c$ but the right transistor 56–51 does. For the last three diode pairs on the left, i.e., 50–6 to 50–8, and for their related switching transistors, everything remains the same. The consequence of the changed situation is determined by sensing the current flowing in the seven collector lines 64–1 to 64–7 of the switching transistors. The first four lines 64–1 to 64–4 and the last two lines 64–6 and 64–7, still carry the current $I_c$. However, the fifth line 64–5 now does not carry current which indicates that the analog signal amplitude is a value between the fifth and the sixth step. Therefore, analog value $I_a$ has been converted to a function of position in the row 49 of diode pairs 50–1 to 50–8.

PRACTICE OF THE INVENTION

An analog to digital converter has been described hereinbefore which is capable of providing continuously and simultaneously the digital values for a given analog signal. The digital indication is not staggered so that any time a full binary word is given. The circuit is suitable particularly for processing high frequency signals so that a wide range of applications can be foreseen. Because of simplicity of the circuit, the manufacturing thereof as an integrated circuit can be conveniently realized thereby reducing manufacturing costs considerably.

The presence of an encoding device is desirable but not necessary. Illustratively, by arranging the number of converter and switching stages needed, a direct decimal digital representation can be achieved. For the number n quantization steps, at least (n − 1) converter stages are needed, because a "zero" as the lowest digital step does not need circuitry. Consequently, the circuits of FIGS. 1A and 2, one diode pair, e.g. the first one of the row which is grounded and the associated constant current source S can be omitted. Ground will then be connected to the node which is tied already to the base of the first switching transistor $T_1$. Similarly, in the embodiment shown in FIG. 4, the diode pair at the extreme left, the two associated switching transistors $T_3$ and the related constant current source $S_c$ can be omitted. The remaining parts of the circuit of FIG. 4 would not be altered.

We claim:

1. Circuit for converting the amplitude of an analog current signal in a given interval of time into a substantially simultaneous digital signal which comprises:

means for generating a stepped current electrical scale having a plurality of n steps for evaluating said analog current amplitude comprising circuit means having at least n-1 pairs of diodes, each said pair having the two diodes thereof connected in parallel with opposed polarity, and means for applying a respective calibrated constant current to said diode pairs at respective terminals thereof for generating therewith said stepped current electrical scale;

means for applying said analog current amplitude to said circuit means having said diode pairs for measuring said amplitude by causing said circuit means to have a related voltage distribution where the location of the highest value is indicative of said analog current amplitude; and means for obtaining in a given interval of time during said measurement a digital signal which indicates said highest voltage value corresponding to the step of said current electrical scale which is exceeded by said analog amplitude in said given interval of time.

2. Circuit as set forth in claim 1 including means for providing a digital representation of said measured analog amplitude from said digital signal having an encoder therein.

3. Circuit as set forth in claim 2 wherein said encoder includes a diode matrix.

4. Circuit as set forth in claim 1 wherein said means for providing said digital representation includes at least one electronic switch for each said step of said scale which is responsive to the potential at a terminal of a related diode pair for selecting the highest step of said electrical scale which is exceeded by said analog amplitude.

5. Circuit as set forth in claim 1 wherein said diode pairs are connected in series in a path which is grounded at one end and a plurality of constant current sources are each connected to one of the nodes respectively between the diode pairs which are not grounded and to the node at the other end of the path for supplying said respective calibrated current to each of said nodes, and conductor means is connected to said node at the other end of the path for drawing said current amplitude.

6. Circuit as set forth in claim 4 wherein said electronic switches are transistors which have respective bases, emitters and collectors, and each base of said transistors is connected to a respective node of a diode pair, and the emitters of said transistors are connected in common to another constant current source which draws a given current which is carried by the one of said transistors which has the highest potential at its base.

7. Circuit as set forth in claim 6 wherein each said switching transistor is associated with a respective feedback network which is related to a respective calibrated current source which is connected to the same node of said row of diode pairs so that said given current which flows through said respective switching transistor increases the calibrated current supplied by said respective calibrated current source by an increment.

8. Circuit as set forth in claim 1 wherein each said diode pair has one terminal thereof grounded and has the other terminal thereof connected to a respective line which supplies a respective calibrated current and said other terminal is further connected to a respective line from which said analog current amplitude is drawn.

9. Circuit as set forth in claim 2 wherein said means for providing said digital representation includes at least one electronic switch for each said step of said scale which is responsive to the potential at a terminal of a related diode pair for selecting the highest step of said electrical scale which is exceeded by said analog amplitude.

10. Circuit as set forth in claim 9 wherein each said electronic switch includes two transistors of which one transistor is connected to one terminal of a respective diode pair and the other transistor is connected to the other terminal of said respective diode pair, both of said transistors which are related to one diode pair are connected to a common constant current source for supplying a given current, and one transistor of said pair of transistors and the neighboring transistor of the adjacent pair of transistors are connected to a respective common line for leading back the given current carried by one of said transistors which are connected to said common line.

11. Circuit as set forth in claim 10 including an encoder for providing a digital representation of said analog amplitude, wherein said common line is connected to said encoder.

12. Method for converting the amplitude of an analog current signal in a given interval of time into a substantially simultaneous digital signal comprising the steps of:

generating a stepped current electrical scale having a plurality of n steps for evaluating said analog current amplitude, measuring said amplitude by causing said electrical scale to have a related voltage distribution with a highest value which is indicative of said analog current amplitude including comparing said analog current with at least one calibrated current of a plurality of calibrated currents which define said steps of said current electrical scale, reversing the polarity of a respective voltage which is related to a respective step of said current electrical scale whenever said analog current increases above said step, and restoring the original polarity of said respective voltage when said analog current decreases below said highest step of said electrical scale; and generating in a given interval of time during measurement a digital signal which indicates said highest voltage value corresponding to said current electrical scale which is exceeded by said analog amplitude in said given interval of time.

13. Method according to claim 12 including the step of generating an analog current proportional to an analog amplitude, comparing said analog current with at least one calibrated current of a plurality of calibrated currents which define said steps of said electrical scale, reversing the polarity of a respective voltage which is related to a respective step of said electrical scale whenever said analog current increases above said step, and restoring the original polarity of said respective voltage when said analog current decreases below said step of said electrical scale.

14. Method according to claim 13 including the step of evaluating said reversal of polarity of said respective voltage for generating said digital signal which indicates the highest step of said electrical scale which is exceeded by said analog current.

15. Method according to claim 13 including the step of increasing by an increment the calibrated current which is supplied to the next higher step in said scale whenever said digital signal is generated.

* * * * *